(12) United States Patent
Boles et al.

(10) Patent No.: US 9,276,468 B2
(45) Date of Patent: Mar. 1, 2016

(54) LOW-NOISE CURRENT SOURCE

(71) Applicant: ANALOG DEVICES, INC., Norwood, MA (US)

(72) Inventors: William T. Boles, Greensboro, NC (US); Michael R. Elliott, Summerfield, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 63 days.

(21) Appl. No.: 13/966,001

(22) Filed: Aug. 13, 2013

(65) Prior Publication Data

US 2015/0048892 A1 Feb. 19, 2015

(51) Int. Cl.
*H03F 3/68* (2006.01)
*H02M 3/156* (2006.01)
*H03B 5/12* (2006.01)
*G05F 3/26* (2006.01)
*H03F 3/16* (2006.01)

(52) U.S. Cl.
CPC ............. *H02M 3/156* (2013.01); *G05F 3/262* (2013.01); *H03B 5/12* (2013.01); *H03F 3/16* (2013.01); *H03F 3/68* (2013.01)

(58) Field of Classification Search
CPC ............. H03B 5/12; H03F 3/68; H03F 3/343; H03F 3/345; G05F 3/30; G05F 3/262; G05F 3/265; G05F 1/467; G05F 1/465; G05F 1/462; G05F 1/46
USPC ......... 330/253, 254, 277, 278, 293, 296, 282, 330/310, 311, 288; 327/108, 554; 331/117; 375/316; 323/312, 315, 316
See application file for complete search history.

(56) References Cited

U.S. PATENT DOCUMENTS

| | | | |
|---|---|---|---|
| 5,493,205 A | 2/1996 | Gorecki et al. | |
| 6,737,909 B2 | 5/2004 | Jaussi et al. | |
| 6,859,159 B2 | 2/2005 | Michalski | |
| 7,012,463 B2 | 3/2006 | Nairn | |
| 7,157,955 B2 | 1/2007 | Wei | |
| 7,279,986 B2 | 10/2007 | Ali | |
| 7,750,739 B2 * | 7/2010 | Fu et al. | 330/292 |
| 7,889,004 B1 | 2/2011 | Murden, II et al. | |
| 8,803,721 B1 | 8/2014 | Boles et al. | |
| 2004/0000954 A1 | 1/2004 | Hoon et al. | |
| 2014/0361836 A1 * | 12/2014 | Chang et al. | 330/296 |

FOREIGN PATENT DOCUMENTS

| | | |
|---|---|---|
| EP | 2837988 | 2/2015 |
| GB | 2095946 | 10/1982 |
| NL | 8403872 | 7/1985 |

OTHER PUBLICATIONS

Maloberti, F., "Analog Design for CMOS VLSI Systems", Kluwer Academic Publishers, printed in 2001, pp. 181.*

(Continued)

*Primary Examiner* — Steven J Mottola
*Assistant Examiner* — Hafizur Rahman
(74) *Attorney, Agent, or Firm* — Patent Capital Group

(57) ABSTRACT

In one aspect, a current source is provided to limit noise and offset. In one embodiment, a source transistor is provided, with current sourced at the drain. A feedback network runs from the source node to the gate. The feedback network produces voltage gain by a transconductance, such as a transistor. Appropriate capacitors are also provided, and two pairs of switches are disposed to provide offset cancellation by toggling between gain and clamp modes in the switched capacitor architecture.

19 Claims, 2 Drawing Sheets

(56) References Cited

OTHER PUBLICATIONS

Niknejad, Ali, EE105 Fall 2007 Lecture notes, Lecture 26, slides 5,12. , UC Berkeley. http://www-inst.eecs.berkeley.edu/~ee105/fa07/lectures.cgi.*

U.S. Appl. No. 13/801,317, filed Mar. 13, 2013.
Notice of Allowance in U.S. Appl. No. 13/801,317 mailed Apr. 4, 2014, 7 pages.
Partial European Search Report for European Patent Application Serial No. 14179037.8 mailed Mar. 3, 2015, 6 pages.

* cited by examiner

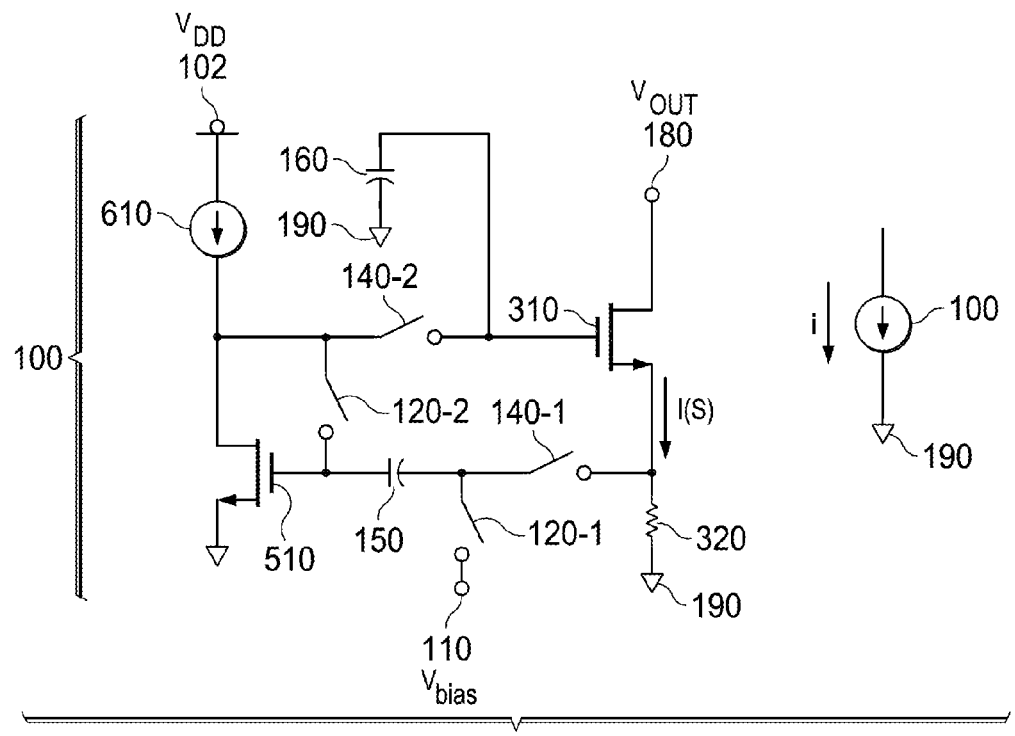
FIG. 1
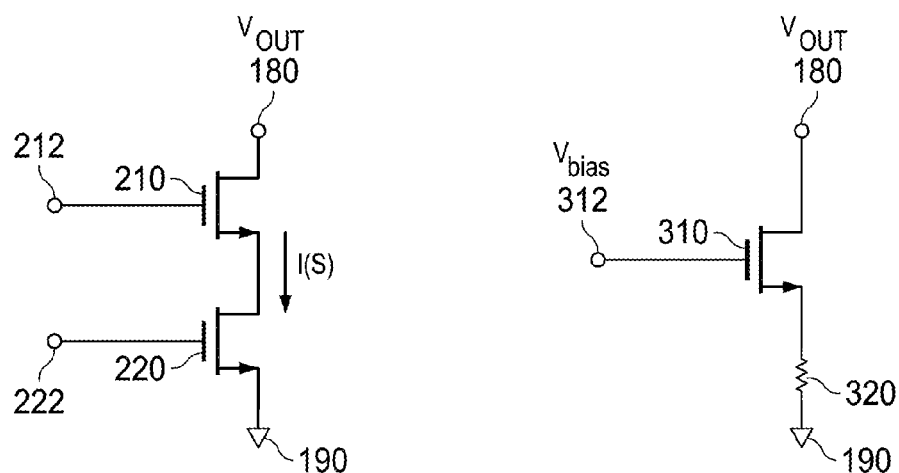
FIG. 2
FIG. 3

US 9,276,468 B2

LOW-NOISE CURRENT SOURCE

CROSS-REFERENCE TO RELATED APPLICATIONS

U.S. patent application Ser. No. 13/801,317 ("the '317 Patent"), titled "System and Method for Improving Speed and Power in a Switched-Capacitor Amplifier," filed Mar. 13, 2013, is incorporated herein by reference in its entirety.

FIELD OF THE INVENTION

This application relates to the field of electronics, and more particularly to a low-noise current source in switched capacitor circuits.

BACKGROUND

Current sources are known in the art. In theory, current source may be divided into several different categories. The most simple is a constant current source, which is configured to provide a fixed, time-invariant i Amperes of steady-state direct current (DC) regardless of input or output conditions. A variation is a fixed alternating current (AC) source, which provides a fixed, time-variant current for example of the form i(t)=i sin(t). Variable current sources are also known in the art, and may be usefully divided into current-controlled current sources, where $i(t)=f(i_{ref}(t))$; and voltage-controlled current sources, where $i(t)=f(v_{ref}(t))$.

Transconductors are also well known in the art. Transconductance is measured in Siemens, and is characterized by $$g_m = \frac{\Delta I_{out}}{\Delta V_{in}}$$

for DC, and $$g_m = \frac{i_{out}}{v_{in}}$$

for small-signal AC.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 is an electrical schematic disclosing various aspects of an example current source according to the present disclosure;

FIG. 2 is an electrical schematic disclosing various aspects of a prior-art current source;

FIG. 3 is an electrical schematic disclosing certain features of the current source of FIG. 1;

DETAILED DESCRIPTION OF THE EMBODIMENTS

Overview

Figure 4:
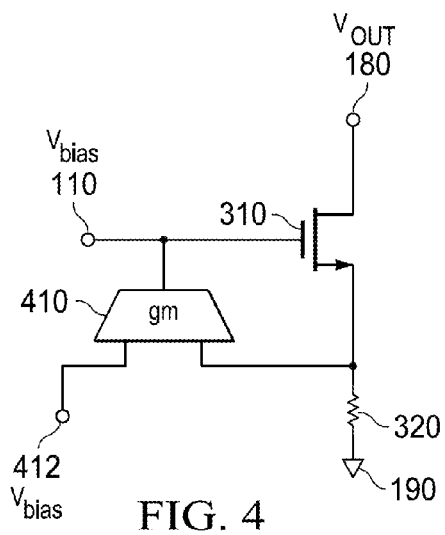
FIG. 4 is an electrical schematic disclosing certain features of the current source of FIG. 1.

In one aspect, there is disclosed A current source comprising a first transconductor having first, second, and third nodes; a second transconductor having first, second, and third nodes, wherein the first node of the first transconductor is electrically coupled to the second node of the second transconductor, and the third node of the first transconductor is electrically coupled to the first node of the second transconductor; and a resistor electrically coupled to the third node of the first transconductor; whereby a substantially constant current is sourced at the third node of the first transconductor.

In another aspect, there is disclosed an integrated circuit comprising a semiconductor substrate having disposed thereon a plurality of microelectronic parts, including a power supply comprising: a first transistor have a gate, a drain, and a source, wherein the source is configured to provide a substantially fixed output current; a second transistor having a gate, a drain, and a source, wherein the gate of the second transistor is electrically coupled to the source of the first transistor; and a resistor electrically coupled from the source of the first transistor to a common node.

In yet another aspect, there is disclosed an amplifier circuit comprising a digital-to-analog converter providing an analog signal voltage; a first amplification stage configured to amplify the analog signal voltage, the first amplification stage including a current source comprising: a first transistor having a gate, a drain, and a source, the first transistor configured to source a current at the source; a second transistor having a gate, a drain, and a source, the gate of the second transistor being electrically coupled to the source of the first transistor and to a bias voltage, the source of the second transistor being electrically coupled to a common node, and the drain of the second transistor receiving an input current; and a resistor electrically coupled between the source of the first transistor and the common node; and a second amplification stage configured to receive an amplified analog signal voltage from the first amplification stage and to provide a gain on the amplified analog signal voltage

Example Embodiments of the Disclosure

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed.

Different embodiment many have different advantages, and no particular advantage is necessarily required of any embodiment.

A theoretical ideal current source provides a constant, flat, noiseless direct current i at a specified level regardless of disturbances, timing, or power constraints. Although such a current source is impossible to realize in a physical circuit, it does provide a baseline against which a real current source's performance can be measure.

As a practical matter, a current source provides an imperfect time- or frequency-varying current. In the frequency domain, the current may be described as $I(s)=i+T_d(s)+K$, where $T_d(s)$ represents a frequency-variant disturbance function and K represents a constant offset value. Both $T_d(s)$ and K may depend both on factors internal to the current source and external to the current source. Internal factors include for example leakage, internal noise, and offsets. External factors include for example timing, power demands, and feedback. $T_d(s)$ may also be particularly dependent on noise in the circuit. In designing a current source, it may be desirable to minimize $T_d(s)$ and K so that $I(s)$ approaches i as nearly as possible.

Throughout this specification, a number of transistors are shown as example transconductors. In particular, a number of n-type metal oxide field effect transistors (nMOSFETs) are disclosed, but those with skill in the art will recognize that nMOSFETs are only one of many such transconductance devices that may be appropriate for this specification. The PMOS version replaces all the NMOS devices with PMOS devices and the ground nodes become VDD or boosted supplies. This PMOS version is used for current in FIG. 6 as device 612. In particular, other embodiments may employ other types of non-passive devices with three or more nodes, such as triodes, bipolar junction transistors (BJT), and junction gate field effect transistors (JFETs) by way of non-limiting example. For ease of reference, all such devices are referred to herein as "transconductors." In general, a transconductor may have at least three nodes, which can be referred to as a first node (base, gate, or similar), second node (source, emitter, or similar), and third node (drain, collector, or similar).

Furthermore, throughout this specification, a number of positive or "supply" voltages are shown, sometimes called "$V_+$," "$V_{CC}$," or "$V_{DD}$," and lower supply voltages are shown, typically called "common," "ground," "V-," "$V_{SS}$," or "$V_{EE}$." By convention, $V_{DD}$ is spoken of as being the most "positive" voltage and $V_{SS}$ is spoken of as being the most "negative" voltage. However, under appropriate circumstances, either $V_{DD}$ or $V_{SS}$ could be considered a "supply" or "positive" voltage, and under other circumstances, either $V_{DD}$ or $V_{SS}$ could be considered a "ground," "negative," or "negative supply" voltage. Those having skill in the art will also recognize that $V_{SS}$ need be neither an absolute ground ("earth" or "chassis"), nor necessarily negative with respect to earth or chassis ground. Furthermore, "positive" and "negative" may be understood in the art to refer simply to two opposite sides of a difference in potential. Thus, where a signal has a "positive side" and a "negative side," those with skill in the art will recognize that this may be construed generally to mean that the positive side of the signal includes those portions above a reference voltage, while the negative side of the signal includes those portions below the reference voltage. In some embodiments, a zero point is defined at earth ground or chassis ground and $V_{DD}$ and $V_{SS}$ will have values of substantially the same magnitude but opposite sign. Also note that throughout this specification, voltages such as Vbias 110, ground 190, and similar labels may be used in different figures. While these may represent an actual voltage node in some embodiments, it is not intended to imply that all ground nodes or all bias nodes must be electrically shorted to similar nodes.

FIG. 1 is a simplified electrical schematic of an example low-noise current source according to the present disclosure. In this example embodiment, current source 100 is initially shown as its circuit symbol. The example circuit disclosed in FIG. 1 is configured to reduce both $T_d(s)$ and K. In this example embodiment, two pairs of switches 120 and 140 are provided, and are mutually exclusive. Thus, switches 120 and 140 provide two modes, a clamp mode, in which switches 120 are closed and switches 140 are open, and a gain mode, in which switches 120 are open and switches 140 are closed. The output current is the same in both states as long as the cap 160 is large enough such that the feedback bandwidth is 1/10 the minimum clock rate. The two phases are needed to refresh the offset nulling voltage on cap 150.

In the example embodiment, a supply voltage $V_{DD}$ 102 is provided, as well as a common or $V_{SS}$ voltage 190. Transconductor 310 is provided to increase the output impedance of the current source making the current less sensitive to the output voltage Vout 180. Transconductor 510 is provided to reduce offset K introduced by non-idealities of transconductor 310. Capacitor 150 is provided at the gate of transconductor 510 to decouple the gate-to-source voltage of transconductor 510 from the voltage across resistor 320 in gain mode, and to offset null the non-idealities of transconductor 510 and reduce K in clamp mode. In clamp mode, the offset of transconductor 510 is sampled across capacitor 150 to provide auto-zeroing, while the bottom plate of capacitor 150 is shorted to Vbias 110.

Also in gain mode, transconductor 510 provides gain to correct the offset contributed by transconductor 310. In this mode, shunt capacitor 160 is also added into the loop to filter noise contributed by transconductor 510. When the circuit returns to clamp mode, shunt capacitor 160 holds the value that it had previously so that the gate of transconductor 310 remains set.

Note that while transconductors 310, 510 are shown in this example embodiment as FETs, it is not intended to limit this disclosure to a specific transconductor. Any suitable transconductor may be substituted for transconductors 310, 510.

Current source 100 can be further understood by additional aspects in isolation. For example, FIG. 2 discloses an example prior art current source comprising a cascode 210 and source transistor 220. Current is sourced to Vout 180. Cascode 210 and source transistor 220 may also be other types of transconductors, and receive respective input voltages 212, 222. Those with skill in the art will recognize that input voltages 212, 222 may be for example Vbias+Vgs or some other combination. In an example circuit, source transistor 220 may dominate both noise $T_d(s)$ and offset K. In certain implementations of this device, transconductor 220 contributes an unacceptable amount of noise $T_d(s)$ and offset K to the circuit. As a design consideration, noise $T_d(s)$ in output current $I(s)$ varies directly with the $g_m$ of source transistor 220.

Noise $T_d(s)$ may be alleviated in the example circuit of FIG. 3, in which a transconductor 310 is paired with a resistor 320, and is provided an input voltage 312, which may be a combined voltage as with input voltages 212 and 222 above. In this embodiment, transconductor 310 is acting as a source transistor. Resistor 320 is chosen to be large with respect to $g_m$ of transconductor 310, so that the voltage drop across resistor 320 is much larger than the effective voltage of transconductor 320. This configuration minimizes noise $T_d(s)$. But in certain embodiments, this configuration may also have an unacceptable offset K, because any error introduced at the gate of transconductor 310 impresses on resistor 320.

As shown in FIG. 4, offset K may be alleviated by introducing a gain that feeds back from the source of transconductor 310 to its gate. The gain may be realized for example by introducing transconductance 410. If transconductance 410 is a theoretical ideal transconductance, it forces the source of transconductor 310 to be equal to Vbias 412. Transconductance 410 cannot be ideal, however. So while this configuration alleviates offset K from transconductor 310, the new transconductance 410 may introduce its own noise $T_d(s)$ and offset K issues. However, the noise $T_d(s)$ and offset K have at least been removed from the DC bias path.

Figure 5:
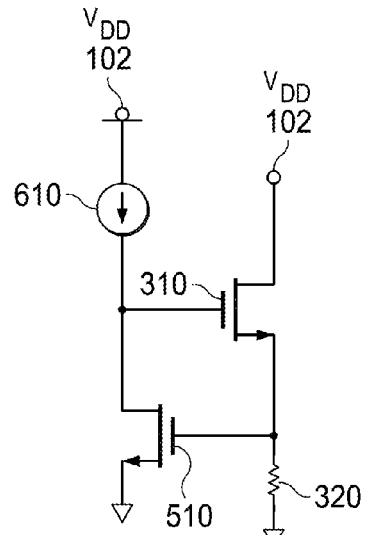
FIG. 5 is an electrical schematic disclosing certain features of the current source of FIG. 1.

Further, as seen in FIG. 5, if transconductance 410 is provided by a single transconductor 510, offset is reduced because a differential pair is not used. However, the top terminal of resistor 320 is now dependent on the gate-to-source voltage of transconductor 510. Additional filtering may be used to alleviate noise $T_d(s)$ and offset K, as shown in the final circuit of FIG. 1.

Figure 6:
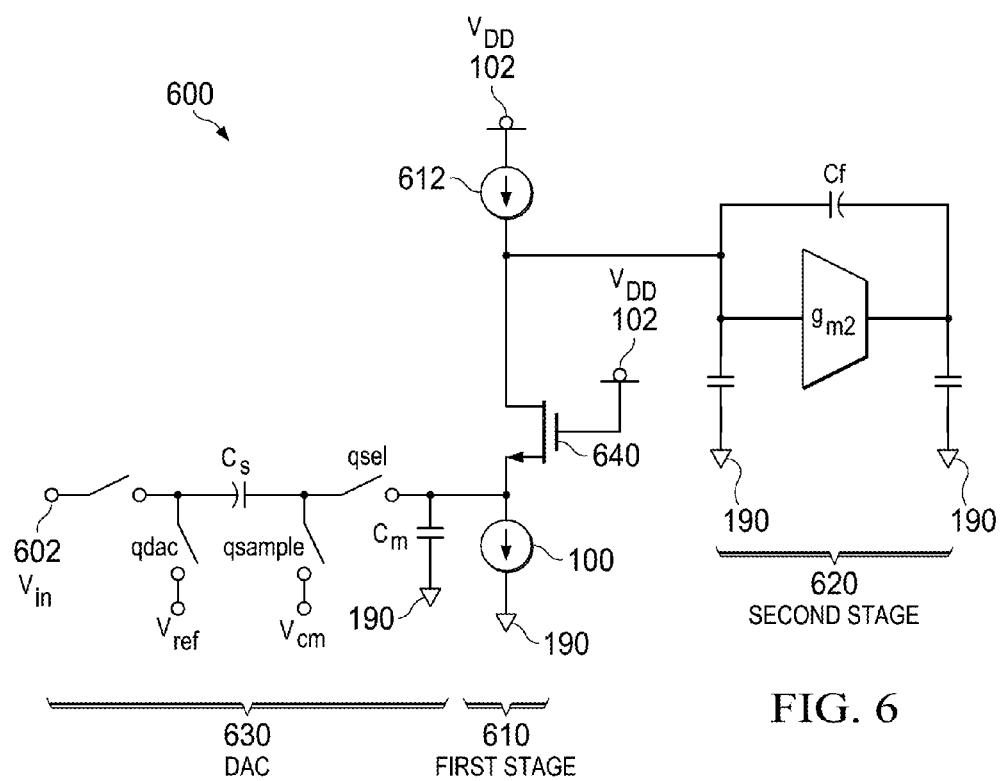
FIG. 6 is an electrical schematic of an example amplifier, disclosing a current source of the present disclosure in situ.

FIG. 6 is a schematic of an example current supply of the present disclosure in situ with an example switched capacitor amplifier circuit 600. Switched capacitor amplifier 600 is described with more detail and particularity in the co-pending '317 Application, which is incorporated herein by reference. In general terms, a digital-to-analog converter feeds into a first stage amplifier, including amplifier 640, which receives current from a first current source 612. In certain embodiments, current source 612 may provide a load current that is equal and opposite of current source 100 and is the PMOS version of the current source of this example embodiment. A current is provided by current source 100, which in an example embodiment is a current source according to the present invention. Output of first stage 610 is provided to second stage 620. In one example embodiment, switched capacitor amplifier 600 is provided on a single integrated circuit, and may be provided as a discrete component, or as part of a package with other components.

In the discussions of the embodiments above, any capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that can execute specialized software programs, or algorithms, some of which may be associated with processing digitized real-time data. Certain embodiments can relate to multi-DSP signal processing, floating point processing, signal/control processing, fixed-function processing, microcontroller applications, etc.

In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner.

Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES, EXAMPLES, AND IMPLEMENTATIONS

Note that all optional features of the apparatus described above may also be implemented with respect to the method or process described herein and specifics in the examples may be used anywhere in one or more embodiments.

In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for clocking data from the digital core onto a first data output of a macro using a first clock, the first clock being a macro clock; means for clocking the data from the first data output of the macro into the physical interface using a second clock, the second clock being a physical interface clock; means for clocking a first reset signal from the digital core onto a reset output of the macro using the macro clock, the first reset signal output used as a second reset signal; means for sampling the second reset signal using a third clock, which provides a clock rate greater than the rate of the second clock, to generate a sampled reset signal; and means for resetting the second clock to a predetermined state in the physical interface in response to a transition of the sampled reset signal.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. A current source, comprising:
a first transconductor having first, second, and third nodes;
a second transconductor having first, second, and third nodes, wherein the first node of the first transconductor is electrically coupled to the second node of the second transconductor, and the third node of the first transconductor is electrically coupled to the first node of the second transconductor;
a resistor electrically coupled to the third node of the first transconductor, wherein a substantially constant current is sourced at the third node of the first transconductor;
a decoupling capacitor connected between the third node of the first transconductor and the first node of the second transconductor;
a first switch connected between the third node of the first transconductor and the decoupling capacitor;
a bias voltage connected between the decoupling capacitor and the first switch;
a second switch connected between the bias voltage and the decoupling capacitor;
a shunt capacitor connected between the first node of the first transconductor and a common node;
a third switch connected between the shunt capacitor and the second node of the second transconductor; and
a fourth switch connected between the first and second nodes of the second transconductors, wherein when the first and third switches are closed with the second and fourth switches open, a gain mode is provided, and with the first and third switches open and the second and fourth switches closed, a clamp mode is provided wherein the shunt capacitor retains at the first node of the first transconductor a value sampled during the gain mode.

2. The current source of claim 1, further comprising a bias current electrically coupled to the first node of the second transconductor.

3. The current source of claim 1, wherein the four switches are transistors.

4. The current source of claim 1, wherein the transconductors are field effect transistors.

5. The current source of claim 1, wherein the transconductors are metal oxide semiconductor field effect transistors.

6. The current source of claim 1, wherein the transconductors are bipolar junction transistors.

7. The current source of claim 1 wherein the current source is configured to provide a gain mode in which the integrated circuit provides an operational gain on an input signal, and a clamp mode in which a shunt capacitor maintains the gate voltage of the first transistor.

8. The current source of claim 7, wherein the gain mode is configured to correct an offset from at least one of the transconductors.

9. An integrated circuit, comprising:
a plurality of microelectronic parts, including a power supply comprising:
a first transistor having a gate, a drain, and a source, wherein the source is configured to provide a substantially fixed output current;

a second transistor having a gate, a drain, and a source, wherein the gate of the second transistor is electrically coupled to the source of the first transistor; and a resistor electrically coupled from the source of the first transistor to a common node;

wherein the current source is configured to provide a gain mode in which the integrated circuit provides an operational gain on an input signal, and a clamp mode in which a shunt capacitor maintains the gate voltage of the first transistor.

10. The integrated circuit of claim 9, further comprising:

a decoupling capacitor connected between the source of the first transistor and the gate of the second transistor;

a first switch connected between the source of the first transistor and the decoupling capacitor;

a bias voltage applied between the decoupling capacitor and the first switch;

a second switch connected between the bias voltage and the decoupling capacitor;

a shunt capacitor connected between the gate of the first transistor and a common node;

a third switch connected between the shunt capacitor and the drain of the second transistor; and a fourth switch connected between gate and the drain of the second transistor;

whereby when the first and third switches are closed with the second and fourth switches open, a gain mode is provided, and with the first and third switches open and the second and fourth switches closed, a clamp mode is provided wherein the shunt capacitor retains at the gate of the first transistor a value sampled during the gain mode.

11. The integrated circuit of claim 9, further comprising a cascode at the drain of the first transistor.

12. The integrated circuit of claim 9, further comprising a shunt capacitor connected between the gate of the first transistor and a common node, and a decoupling capacitor connected between the source of the first transistor and the gate of the second transistor.

13. The current source of claim 9, wherein the gain mode is configured to correct an offset from at least one of the transconductors.

14. An amplifier circuit, comprising:

a digital-to-analog converter providing an analog signal voltage;

a first amplification stage configured to amplify the analog signal voltage, the first amplification stage including a current source comprising:

a first transistor having a gate, a drain, and a source, the first transistor configured to source a current at the source;

a second transistor having a gate, a drain, and a source, the gate of the second transistor being electrically coupled to the source of the first transistor and to a bias voltage, the source of the second transistor being electrically coupled to a common node, and the drain of the second transistor receiving an input current; and a resistor electrically coupled between the source of the first transistor and the common node; and a second amplification stage configured to receive an amplified analog signal voltage from the first amplification stage and to provide a gain on the amplified analog signal voltage.

15. The amplifier circuit of claim 14, further comprising a shunt capacitor connected between the gate of the first transistor and the common node.

16. The amplifier circuit of claim 14, further comprising a decoupling capacitor connected between the gate of the second capacitor and the bias voltage.

17. The amplifier circuit of claim 14, further comprising:

a decoupling capacitor connected between the source of the first transistor and the gate of the second transistor;

a first switch connected between the source of the first transistor and the decoupling capacitor;

the bias voltage applied between the decoupling capacitor and the first switch;

a second switch connected between the bias voltage and the decoupling capacitor;

a shunt capacitor connected between the gate of the first transistor and a common node;

a third switch connected between the shunt capacitor and the drain of the second transistor; and a fourth switch connected between gate and the drain of the second transistor;

whereby when the first and third switches are closed with the second and fourth switches open, a gain mode is provided, and with the first and third switches open and the second and fourth switches closed, a clamp mode is provided wherein the shunt capacitor retains at the gate of the first transistor a value sampled during the gain mode.

18. The amplifier circuit of claim 14, further comprising circuitry to provide a gain mode in which the integrated circuit provides an operational gain on an input signal, and a clamp mode in which a shunt capacitor maintains the gate voltage of the first transistor.

19. The current source of claim 14, wherein the gain mode is configured to correct an offset from at least one of the transconductors.

* * * * *